United States Patent
Din et al.

(10) Patent No.: US 8,664,999 B2
(45) Date of Patent: Mar. 4, 2014

(54) MIXER ARRANGEMENT

(75) Inventors: Imad ud Din, Lund (SE); Roland Strandberg, Furulund (SE); Lars Sundstrom, Sodra Sandby (SE)

(73) Assignee: Telefonaktiebolaget L M Ericsson (Publ), Stockholm (SE)

( * ) Notice: Subject to any disclaimer, the term of this patent is extended or adjusted under 35 U.S.C. 154(b) by 0 days.

(21) Appl. No.: 13/514,070

(22) PCT Filed: Dec. 7, 2010

(86) PCT No.: PCT/EP2010/069070
§ 371 (c)(1),
(2), (4) Date: Jun. 6, 2012

(87) PCT Pub. No.: WO2011/070013
PCT Pub. Date: Jun. 16, 2011

(65) Prior Publication Data
US 2013/0009688 A1    Jan. 10, 2013

Related U.S. Application Data (60) Provisional application No. 61/299,546, filed on Jan. 29, 2010.

(30) Foreign Application Priority Data

Dec. 11, 2009 (EP) .................................... 09178903

(51) Int. Cl.
*H04B 1/26* (2006.01)
(52) U.S. Cl.
USPC .......................................... 327/355; 455/326
(58) Field of Classification Search
USPC .......... 327/355, 356; 455/296, 303–305, 313, 455/317, 323, 326
See application file for complete search history.

(56) References Cited

U.S. PATENT DOCUMENTS

| 8,138,817 B2 * | 3/2012 | Brekelmans et al. ......... 327/355 |
| 2005/0059376 A1 | 3/2005 | Davis |
| 2005/0239430 A1 | 10/2005 | Shah |

FOREIGN PATENT DOCUMENTS

| FR | 2864375 A1 | 6/2005 |
| WO | 2009057051 A2 | 5/2009 |

OTHER PUBLICATIONS

Jeffrey A. Weldon et al.: "A 1.75-GHz Highly Integrated Narrow-Band CMOS Transmitter with Harmonic-Rejection Mixers", IEEE Journal of Solid-State Circuits, IEEE Service Center, Piscataway, NJ, vol. 36, No. 12, pp. 2003-2015, Dec. 1, 2001.

*Primary Examiner* — Patrick O'Neill
(74) *Attorney, Agent, or Firm* — Rothwell, Figg, Ernst & Manbeck, P.C.

(57) ABSTRACT

A mixer arrangement for generating an analog output signal by mixing an analog input signal with a discrete-time mixing signal. The mixer arrangement comprises a plurality of unit elements. Each unit element is adapted to be in an enabled mode in a first state of an enable signal supplied to the unit element, and in a disabled mode in a second state of the enable signal. Each unit element is adapted to generate the output signal of the unit element based on the analog input signal of the mixer arrangement in the enabled mode but not in the disabled mode. The unit elements are connected for generating a common output signal as the sum of the output signals from the unit elements. The mixer arrangement is adapted to generate the analog output signal of the mixer arrangement based on the common output signal. A corresponding method is also disclosed.

28 Claims, 6 Drawing Sheets

MIXER ARRANGEMENT

CROSS REFERENCE TO RELATED APPLICATION(S)

This application is a 35 U.S.C. §371 National Phase Entry Application from PCT/EP2010/069070, filed Dec. 7, 2010, designating the United States, and claiming priority to U.S. Provisional Application Ser. No. 61/299,546, filed Jan. 29, 2010, and to EP Application No. 09178903.2, filed Dec. 11, 2009, the disclosures of which are incorporated herein in their entirety by reference.

TECHNICAL FIELD

The present invention relates to a mixer arrangement for frequency translation of an electrical signal. Furthermore, the present invention relates to a method of operating the mixer arrangement.

BACKGROUND

Mixers are normally used in radio transmitter or receiver circuits for frequency translation of signals between different frequency bands, such as basebands, intermediate frequency (IF) bands, and radio frequency (RF) bands.

In order to facilitate wireless communication at increasing data rates, various new standards and systems for mobile communication are emerging. Specifications for fourth generation (4G) mobile communication systems are being drawn up under IMT (International Mobile Telecommunication) Advanced. Future communication systems to be compliant with IMT Advanced require relatively wide RF (Radio Frequency) frequency bands, e.g. to accommodate relatively high bit rates. A problem that has been identified for communication systems compliant with IMT Advanced is that there is normally a lack of sufficiently wide free RF frequency bands; most frequency bands are fragmented, e.g. with different parts of a band being licensed for usage by different operators etc. Continuous frequency bands of e.g. 100 MHz bandwidth or more are normally not available. One way to address this problem is to set up a transmission link between a base station and mobile terminal using several sub bands that are scattered across a total frequency bandwidth to form an aggregated spectrum.

An example of an emerging cellular system is 3G Long Term Evolution (3G LTE). In 3G LTE, signals are transmitted using OFDM (Orthogonal Frequency Division Multiplexing) in a multiple access technique referred to as OFDMA (Orthogonal Frequency Division Multiple Access) in the downlink from a base station to a mobile terminal. Different groups of subcarriers, commonly referred to as resource blocks (RBs), of OFDM symbols transmitted from the base station can be allocated to different mobile terminals, whereby multiple access is obtained.

For the examples mentioned above, the frequency band or bands allocated to a particular mobile terminal are normally not fixed, but may vary over time within a relatively large range of possible frequency bands. Relatively hard requirements may be set on mixer arrangements used for frequency translation in transmitters and/or receivers, e.g. in terms of suppression of harmonics of local oscillator (LO) signals.

WO 2009/057051 discloses an electronic device comprising a passive harmonic-rejection mixer. The passive harmonic rejection mixer has an input connected to several sub-mixer stages, and the sub-mixer stages are connected to a summing module for generating the output. Each sub-mixing stage comprises a gating module and a respective amplifier, the gating module adapted to selectively pass the input signal or the input signal with inverted polarity under the control of control signals.

SUMMARY

An object of the present invention is to provide a mixer arrangement for frequency translation of signals.

According to a first aspect, there is provided a mixer arrangement for generating an analog output signal of the mixer arrangement by mixing an analog input signal of the mixer arrangement with a discrete-time mixing signal. The mixer arrangement comprises a plurality of unit elements. Each unit element comprises an enable port for receiving an enable signal of the unit element. Furthermore, each unit element comprises an input port for receiving the analog input signal of the mixer arrangement. Moreover, each unit element comprises an output port for outputting an output signal of the unit element. Each unit element is adapted to be in an enabled mode in a first state of the enable signal and in a disabled mode in a second state of the enable signal. Furthermore, each unit element is adapted to generate the output signal of the unit element such that the output signal of the unit element is based on the analog input signal of the mixer arrangement in the enabled mode but not in the disabled mode. The unit elements are connected for generating a common output signal as the sum of the output signals from the unit elements. Furthermore, the mixer arrangement is adapted to generate the analog output signal of the mixer arrangement based on the common output signal.

The mixer arrangement comprises a control unit adapted to supply the enable signals to the unit elements and control said enable signals based on the discrete-time mixing signal such that the number of enabled unit elements is proportional to a control signal derived from the discrete-time mixing signal.

Moreover, according to some embodiments, the control unit is adapted to select the number of unit elements to be enabled when the control signal adopts a given value based on a parameter set of one or more control parameters. According to some embodiments, said parameter set comprises the ratio $f_S/f_M$ between the sampling frequency $f_S$ and the frequency $f_M$ of the discrete time mixing signal and/or a phase shift of the discrete-time mixing signal.

The mixer arrangement may be adapted to generate the output signal of the mixer arrangement proportional to the common output signal and the control signal may, in that case, be equal to the absolute value of the discrete-time mixing signal. Each unit element may be then be adapted to generate the output signal of the unit element by mixing the analog input signal of the mixer arrangement with the sign of the discrete-time mixing signal in the enabled state.

Alternatively, the mixer arrangement may comprise a switched mixer element arranged to receive the common output signal on an input port and the sign of the discrete-time mixing signal on a control port. The switched mixer element may be adapted to mix the common output signal with the sign of the discrete time mixing signal for generating the output signal of the mixer arrangement. In this case, the control signal may be equal to the absolute value of the discrete-time mixing signal, and each unit element may be adapted to generate the output signal of the unit element as an essentially linear function of the analog input signal of the mixer arrangement.

The control unit may be adapted to, based on a set of harmonics of the discrete-time mixing signal to be suppressed, set the sampling frequency $f_S$ of the discrete-time mixing signal to $f_S = L \cdot f_M$, where L is an integer >1 and $f_M$ is the frequency of the discrete-time mixing signal. Furthermore, the control unit may be adapted to select the value of L large enough such that all harmonics in said set of harmonics to be suppressed are suppressed.

Furthermore, the control unit may be adapted to set the sampling frequency $f_S$ of the discrete time mixing signal to $6 \cdot f_M$, where $f_M$ is the frequency of the discrete-time mixing signal, and set a phase-shift of the discrete-time mixing signal such that the samples of the discrete-time mixing signal is given by $$A \cdot \sin\left(\frac{\pi}{3} n + \frac{\pi}{3} L_0 - \frac{\pi}{6}\right)$$

where A is a constant, n is a sequence index, and $L_0$ is an integer, for suppressing harmonics of integer multiple orders of 3 of the discrete-time mixing signal.

The control unit may comprise a look-up table having stored therein predetermined values representing said number of unit elements to be enabled when the control signal adopts said given value to be selected based on the control parameters in the parameter set. Furthermore, the mixer arrangement may comprise a gain compensation circuit with variable gain for compensating a change in the number of unit elements to be enabled when the control signal adopts said given value.

The control unit may be adapted to dynamically select the unit element or elements to be enabled for a given value of the control signal according to a dynamic element matching scheme for suppressing mismatch between unit elements.

Each unit element may comprise a switchable transconductor. Furthermore, the mixer arrangement may have a differential architecture.

According to a second aspect, there is provided a method of operating a mixer arrangement for generating an analog output signal of the mixer arrangement by mixing an analog input signal of the mixer arrangement with a discrete-time mixing signal. The mixer arrangement comprises a plurality of unit elements. Each unit element comprises an enable port for receiving an enable signal of the unit element. Furthermore, each unit element comprises an input port for receiving the analog input signal of the mixer arrangement. Moreover, each unit element comprises an output port for outputting an output signal of the unit element. Each unit element is adapted to be in an enabled mode in a first state of the enable signal and in a disabled mode in a second state of the enable signal. Furthermore, each unit element is adapted to generate the output signal of the unit element such that the output signal of the unit element is based on the analog input signal of the mixer arrangement in the enabled mode but not in the disabled mode. The unit elements are connected for generating a common output signal as the sum of the output signals from the unit elements. Furthermore, the mixer arrangement is adapted to generate the analog output signal of the mixer arrangement based on the common output signal.

The method comprises generating a control signal from the discrete-time mixing signal. Furthermore, the method comprises generating said enable signals to the unit elements based on the discrete-time mixing signal such that the number of enabled unit elements is proportional to the control signal.

Moreover, according to some embodiments, the method comprises selecting the number of unit elements to be enabled when the control signal adopts a given value based on a parameter set of one or more control parameters. According to some embodiments, said parameter set comprises the ratio $f_S/f_M$ between the sampling frequency $f_S$ and the frequency $f_M$ of the discrete time mixing signal and/or a phase shift of the discrete-time mixing signal.

The mixer arrangement may be adapted to generate the output signal of the mixer arrangement proportional to the common output signal, each unit element may be adapted to generate the output signal of the unit element by mixing the analog input signal of the mixer arrangement with the sign of the discrete-time mixing signal in the enabled state. In that case, generating the control signal may comprise generating the control signal equal to the absolute value of the discrete-time mixing signal.

Alternatively, the mixer arrangement may comprise a switched mixer element arranged to receive the common output signal on an input port and the sign of the discrete-time mixing signal on a control port. Furthermore, the switched mixer element may be adapted to mix the common output signal with the sign of the discrete time mixing signal for generating the output signal of the mixer arrangement. Moreover, each unit element may be adapted to generate the output signal of the unit element as an essentially linear function of the analog input signal of the mixer arrangement. In this case, generating the control signal may comprise generating the control signal equal to the absolute value of the discrete-time mixing signal.

The method may comprise, based on a set of harmonics of the discrete-time mixing signal to be suppressed, setting the sampling frequency $f_S$ of the discrete-time mixing signal to $f_S = L \cdot f_M$, where L is an integer >1 and $f_M$ is the frequency of the discrete-time mixing signal and selecting the value of L large enough such that all harmonics in said set of harmonics to be suppressed are suppressed.

Furthermore, the method may comprise setting the sampling frequency $f_S$ of the discrete time mixing signal to $6 \cdot f_M$, where $f_M$ is the frequency of the discrete-time mixing signal, and setting a phase-shift of the discrete-time mixing signal such that the samples of the discrete-time mixing signal is given by $$A \cdot \sin\left(\frac{\pi}{3} n + \frac{\pi}{3} L_0 - \frac{\pi}{6}\right)$$

where A is a constant, n is a sequence index, and $L_0$ is an integer, for suppressing harmonics of integer multiple orders of 3 of the discrete-time mixing signal.

Selecting the number of unit elements to be enabled when the control signal adopts said given value may comprise fetching, based on the control parameters in the parameter set, a value representing said number of unit elements from a look-up table having stored therein predetermined such values.

The method may comprise dynamically selecting the unit element or elements to be enabled for a given value of the control signal according to a dynamic element matching scheme for suppressing mismatch between unit elements.

According to a third aspect, there is provided an electronic apparatus comprising the mixer arrangement according to the first aspect.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Various embodiments of a mixer arrangement 1 adapted to generate an analog output signal of the mixer arrangement 1 by mixing an analog input signal of the mixer arrangement 1 with a discrete-time mixing signal are described in the following. According to embodiments of the present invention, the discrete-time mixing signal is a sinusoidal signal $$m(n) = A\sin\left(2\pi n \frac{f_M}{f_S} + \phi\right) \quad \text{(Eq. 1)}$$

where m(n) denotes the discrete-time mixing signal, n is a sequence index, A is an amplitude, $f_M$ is the frequency of the discrete-time mixing signal, $f_S$ is the sampling frequency of the discrete-time mixing signal, and $\phi$ is a phase shift of the discrete-time mixing signal. In examples and embodiments presented below, the amplitude A is normally set to 1. In embodiments described below, the discrete-time mixing signal m(n) is represented with a finite number of levels. Hence, in these embodiments, m(n) is in practice equal to a quantized version of the right-hand side of Eq. 1. Furthermore, according to embodiments of the present invention, the analog output signal of the mixer arrangement 1 should ideally be equal to the analog input signal of the mixer arrangement 1 multiplied by a piecewise constant signal which is equal to m(n) (plus possibly an offset in some embodiments) in the time interval $n/f_S \leq t < (n+1)/f_S$. The piecewise constant signal which is equal to m(n) in the time interval $n/f_S \leq t < (n+1)/f_S$ is in the following referred to as m(t). However, e.g. due to limited bandwidth of circuit components, nonlinear circuit components, noise, and limited manufacturing accuracy for circuit components, the analog output signal of the mixer arrangement 1 will in practice be only approximately equal to the product of the analog input signal of the mixer arrangement 1 and said piecewise constant signal.

In general for embodiments described herein, where a discrete-time signal is utilized in the continuous time domain (e.g. for control, multiplication, etc.), the sample value of that signal for the sequence index n is utilized in the time interval $n/f_S \leq t < (n+1)/f_S$. The value utilized at the endpoints of such an interval (i.e. at integer multiples of $1/f_S$) is irrelevant. For example, the value utilized at $(n+1)/f_S$ can e.g. be either the sample value of the signal for the sequence index n or n+1. For any discrete-time signal d(n), the notation d(t) (i.e. replacing n with t) is in the following used for a piecewise constant signal that is equal to a discrete-time signal d(n) in the time interval $n/f_S \leq t < (n+1)/f_S$.

Figure 1:
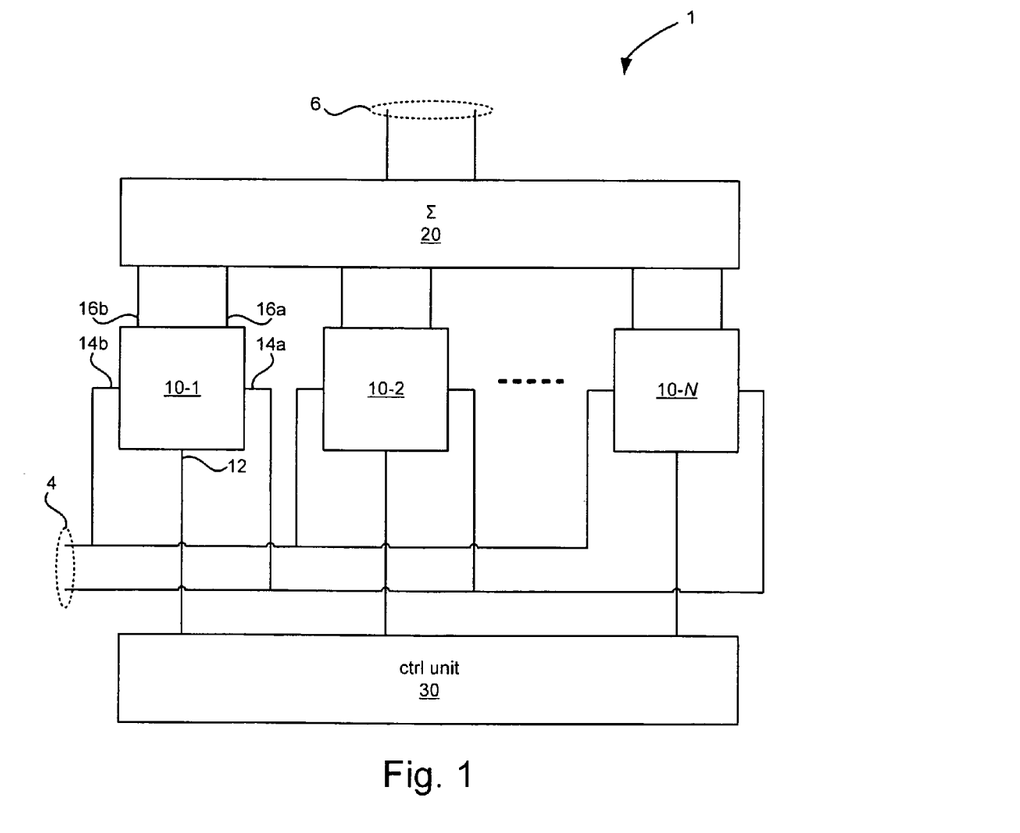
FIGS. 1-2 are block diagrams of mixer arrangements according to embodiments of the present invention.

FIG. 1 is a block diagram of the mixer arrangement 1 according to an embodiment of the present invention. The mixer arrangement 1 has an input port 4 for receiving the analog input signal. Furthermore, the mixer arrangement 1 has an output port for outputting the analog output signal. The mixer arrangement 1 comprises a plurality of unit elements 10-1, ..., 10-N. Each of the unit elements 10-1, ..., 10-N comprises an enable port 12 for receiving an enable signal of the unit element, an input port, comprising input terminals 14a-b, for receiving the analog input signal of the mixer arrangement 1, and an output port, comprising output terminals 16a-b, for outputting an output signal of the unit element 10-1, ..., 10-N. All of the unit elements may be designed for identical functionality.

The embodiment of the mixer arrangement 1 illustrated in FIG. 1 has a differential architecture, with a differential input port 4 and a differential output port 6, and all of the unit elements 10-1, ..., 10-N likewise have differential input and output ports, comprising the input terminals 14a-b and output terminals 16a-b, respectively. Although differential architectures are considered for the embodiments described herein, single-ended architectures may be employed in other embodiments.

The unit elements 10-1, ..., 10-N are connected for generating a common output signal as the sum of the output signals from the unit elements 10-1, ..., 10-N. In the embodiment illustrated in FIG. 1, this is accomplished with the summation unit 20. For embodiments where the output signals of the unit elements 10-1, ..., 10-N are represented with electrical currents, the summation unit 20 may be implemented by simply interconnecting all output terminals 16a of the unit elements 10-1, ..., 10-N, and likewise interconnecting all output terminals 16b of the unit elements 10-1, ..., 10-N.

Each unit element 10-1, ..., 10-N is adapted to be in an enabled mode in a first state of the enable signal of the unit element 10-1, ..., 10-N and in a disabled mode in a second state of the enable signal of the unit element 10-1, ..., 10-N. Furthermore, each unit element 10-1, ..., 10-N is adapted to generate the output signal of the unit element 10-1, ..., 10-N such that the output signal of the unit element 10-1, ..., 10-N is based on the analog input signal of the mixer arrangement 1 in the enabled mode but not in the disabled mode. The unit element 10-1, ..., 10-N may accordingly, in some embodiments, be adapted to generate the output signal of the unit element 10-1, ..., 10-N based on the analog input signal of the mixer arrangement 1 only in the enabled mode. For example, in the enabled mode, the unit element 10-1, ..., 10-N may be adapted to generate the output signal of the unit element according to a linear relationship $y_{unit}(t)=kx(t)$ (plus possibly an offset in some embodiments), where $y_{unit}(t)$ denotes the output signal of the unit element 10-1, ..., 10-N, x(t) denotes the analog input signal of the mixer arrangement, t denotes time, and k is a constant, or an approximation of such a linear relationship (for example, when implementing the unit elements with inherently nonlinear components such as transistors, a certain degree of nonlinearity is normally inevitable). In examples described below, each unit element is assumed to have, in the enabled mode, the input-output relationship $$y_{unit}(t)=kx(t) \tag{Eq. 2}$$

In the disabled mode, the unit element 10-1, ..., 10-N may e.g. be adapted to generate the output signal of the unit element 10-1, ..., 10-N as a zero signal (or "no signal"), a predefined signal that results in a floating output, or a signal that does not provide any contribution (or only negligible contribution) to the common output signal. Hence, the unit element 10-1, ..., 10-N may be adapted to generate the output signal of the unit clement 10-1, ..., 10-N independently of the input signal.

According to embodiments of the present invention, the mixer arrangement 1 is adapted to generate the analog output signal of the mixer arrangement 1 based on the common output signal. In the embodiment illustrated in FIG. 1, the mixer arrangement 1 is adapted to generate the output signal of the mixer arrangement 1 equal to the common output signal. More generally, the mixer arrangement 1 may be adapted to generate the output signal of the mixer arrangement 1 proportional to the common output signal. Further alternatives are described below in the context of specific embodiments.

According to embodiments of the present invention, the mixer arrangement 1 comprises a control unit 30 adapted to supply the enable signals to the unit elements 10-1, ..., 10-N and control said enable signals based on the discrete-time mixing signal such that the number of enabled unit elements 10-1, ..., 10-N is proportional to a control signal derived from the discrete-time mixing signal. The control signal is in the following denoted c(n).

In embodiments where the mixer arrangement 1 is adapted to generate the output signal of the mixer arrangement 1 proportional to the common output signal, e.g. as in the embodiment illustrated in FIG. 1, the control signal is equal to a level-shifted version of the discrete-time mixing signal, i.e.

$$c(n)=m(n)+m_{LS} \tag{Eq. 3}$$

where c(n) denotes the control signal and $m_{LS}$ is a level-shifting constant selected such that c(n) does not adopt negative values. In this case, the common output signal (denoted $y_C(t)$) becomes $$y_C(t)=c(t)kx(t)=kx(t)m(t)+kx(t)m_{LS}. \tag{Eq. 4}$$

Figure 2:
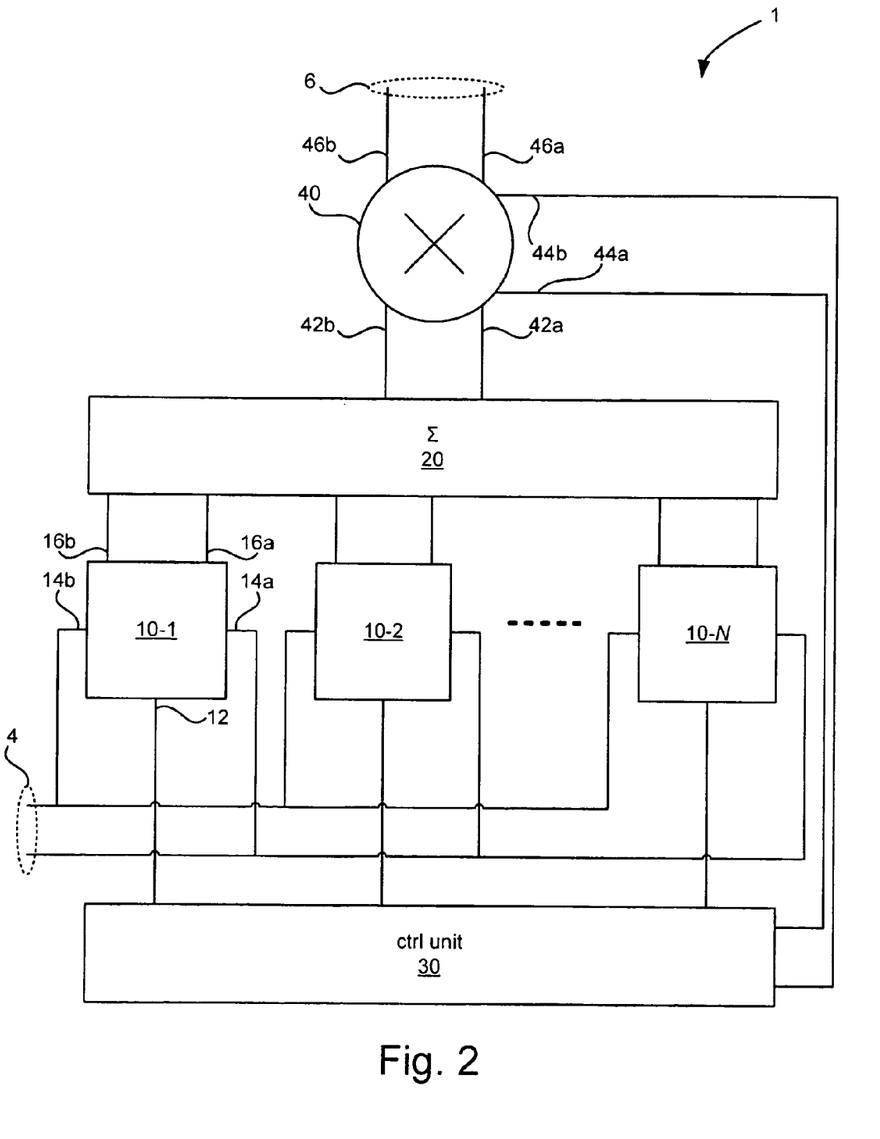

FIG. 2 is a block diagram of the mixer arrangement 1 according to another embodiment of the present invention. In addition to the circuit elements of the embodiment illustrated in FIG. 1, the embodiment of the mixer arrangement 1 illustrated in FIG. 2 comprises a switched mixer element 40. The switched mixer element 40 is arranged to receive the common output signal on an input port, comprising input terminals 42a-b, and the sign of the discrete-time mixing signal on a control port, comprising control terminals 44a-b. In the embodiment illustrated in FIG. 2, the sign of the discrete-time mixing signal is supplied by the control unit 30 to the switched mixer element 40 as a differential signal. In alternative embodiments, the control unit 30 may be adapted to supply the sign of the discrete-time mixing signal as a single-ended signal, and the switched mixer element 40 may be adapted to convert this single-ended signal to a differential signal if necessary.

The switched mixer element 40 is adapted to mix the common output signal with the sign of the discrete time mixing signal for generating the output signal of the mixer arrangement 1. Furthermore, the control signal is equal to the absolute value of the discrete-time mixing signal. For this embodiment, the common output signal becomes $$y_c(t)=c(t)kx(t)=|m(t)|kx(t) \tag{Eq. 5}$$

and the analog output signal (denoted y(t))of the mixer arrangement becomes $$y(t)=\text{sign}(m(t))y_C(t)=m(t)kx(t). \tag{Eq. 6}$$

An advantage of the embodiment illustrated in FIG. 2 compared with the embodiment illustrated in FIG. 1 is that the (normally unwanted) term $kx(t)m_{LS}$ (present in Eq. 4) is absent in the analog output signal given by Eq. 6.

Figure 3:
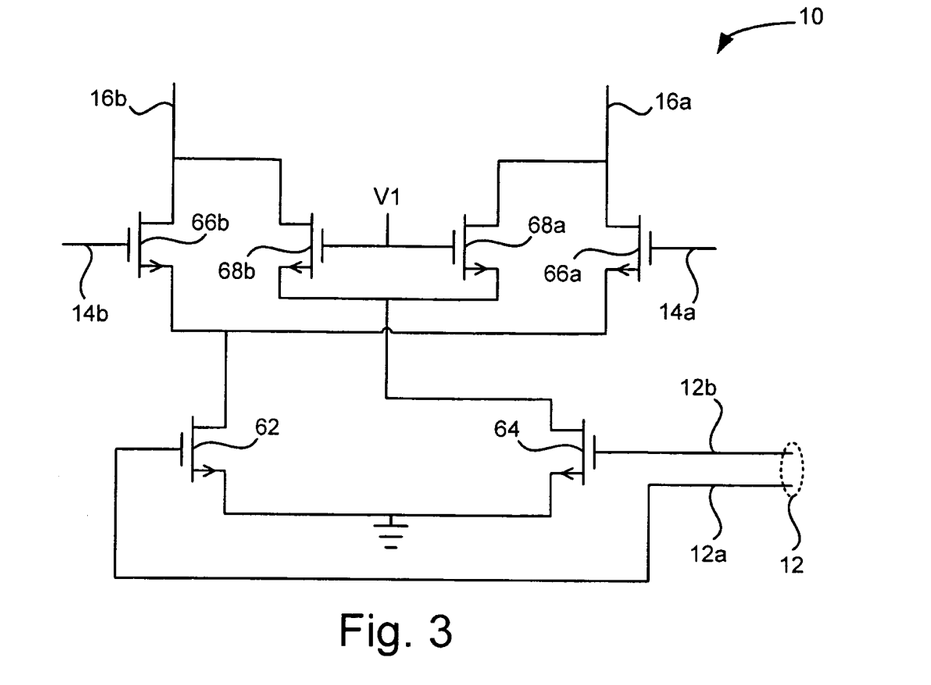
FIG. 3 is a schematic circuit diagram of a unit element according to an embodiment of the present invention.

According to some embodiments of the present invention, the unit elements may be implemented as switchable transconductors that can be switched on (in the enabled mode) and off (in the disabled mode). In these embodiments, the input signal of the mixer arrangement (and thus of the unit elements) is represented with an input voltage, and the output signals of the unit elements are represented with output currents. In the enabled mode, the switchable transconductor delivers its output current in dependence of the input voltage. In the disabled mode, the output current is independent of the input voltage. FIG. 3 is a schematic circuit diagram of such a unit element 10 according to an embodiment of the present invention. All the unit elements 10-1, ..., 10-N can be implemented as the unit element 10 illustrated in FIG. 3.

According to the embodiment illustrated in FIG. 3, the unit element 10 comprises two control transistors 62 and 64. The enable port 12 of the unit element 10 is a differential control port comprising control terminals 12a and 12b. Thus, in this embodiment, the enable signal of the unit element 10 is a differential enable signal. The gate of the control transistor 62 is connected to the control terminal 12a and the gate terminal of the control transistor 64 is connected to the control terminal 12b. The source terminals of both transistors 62 and 64 are connected to a ground node. The transistors 62 and 64 may have the same width (W) over length (L) ratio W/L. For example, the transistors 62 and 64 may have the same W and the same L. In the following description, the transistors 62 and 64 are assumed to have the same W and the same L. Furthermore, the unit element 10 illustrated in FIG. 3 comprises transistors 66a and 66b connected in a differential-pair configuration. The gate terminals of the transistors 66a and 66b are connected to the input terminals 14a and 14b, respectively, and are thus arranged to receive the differential input voltage of the mixer arrangement. The common source terminal of the transistors 66a and 66b are connected to the drain terminal of the control transistor 62. The drain nodes of the transistors 66a and 66b are connected to the output terminals 16a and 16b, respectively of the unit element 10. Furthermore, the unit element 10 comprises transistors 68a and 68b. The gate terminals of the transistors 68a and 68b are interconnected and biased with a voltage V1. The source terminals of the transistors 68a and 68b are also interconnected, and connected to the drain terminal of the control transistor 64. The drain terminals of the transistors 68a and 68b are connected to the output terminals 16a and 16b, respectively of the unit element 10.

All of the transistors 66a-b and 68a-b may have the same W/L. For example, all of the transistors 66a-b and 68a-b may have the same W and the same L. In the following description, all of the transistors 66a-b and 68a-b are assumed to have the same W and the same L.

In the enabled state, the voltage on the control terminal 12a is a "high" voltage that sets the control transistor 62 in a conducting state and the voltage on the control terminal 12b is a "low" voltage (such as but not limited to ground, or 0 V) that sets the control transistor 64 in a non-conducting state. That is, the control transistor 62 is switched on and the control transistor 64 is switched off. In that state, the control transistor 62 acts as a current source that provides a bias current for the differential pair comprising transistors 66a and 66b. This differential pair in turn generates a differential output current of the unit element 10 that is delivered to the output port, comprising output terminals 16a and 16b, of the unit element 10. The differential output current is based on the differential input voltage of the mixer arrangement 1.

In the disabled state, the voltage on the control terminal 12b is said "high" voltage that sets the control transistor 64 in a conducting state and the voltage on the control terminal 12a is said "low" voltage that sets the control transistor 62 in a non-conducting state. That is, the control transistor 64 is switched on and the control transistor 62 is switched off. In that state, the control transistor 64 acts as a current source that provides a bias current for transistors 68a and 68b. Transistors 68a and 68b in turn forwards approximately (or ideally, exactly) half the bias current to the output terminal 16a and the other half to the output terminal 16b of the unit element 10. In other words, the differential output current of the unit element 10 is approximately zero in the disabled mode.

Said "high" voltage may be selected in various ways in different embodiments. For example, the "high" voltage may be generated on the gate terminal of a diode-connected transistor (i.e. transistor connected with its drain terminal to its gate terminal), which is supplied with a reference current to its drain terminal. In the enabled state, the diode-connected transistor and the control transistor 62 may be connected in a current-mirror configuration with the diode-connected transistor as an input transistor and the control transistor 62 as an output transistor that mirrors said reference current. Similarly, in the disabled state, the same diode-connected transistor (or another diode-connected transistor) and the control transistor 64 may be connected in a current-mirror configuration with the diode-connected transistor as an input transistor and the control transistor 64 as an output transistor that mirrors said reference current. Alternatively, a reference voltage, such as but not limited to a supply voltage of the mixer arrangement 1 may be used as the "high" voltage.

Since the control transistors 62 and 64 have the same W and L, the respective bias currents generated thereby in the enabled and disabled states are approximately equal. This means that the common-mode output current of the unit element 10 is approximately the same in the disabled state as in the enabled state, which in turn facilitates a relatively stable operating point of the overall mixer arrangement.

Figure 4:
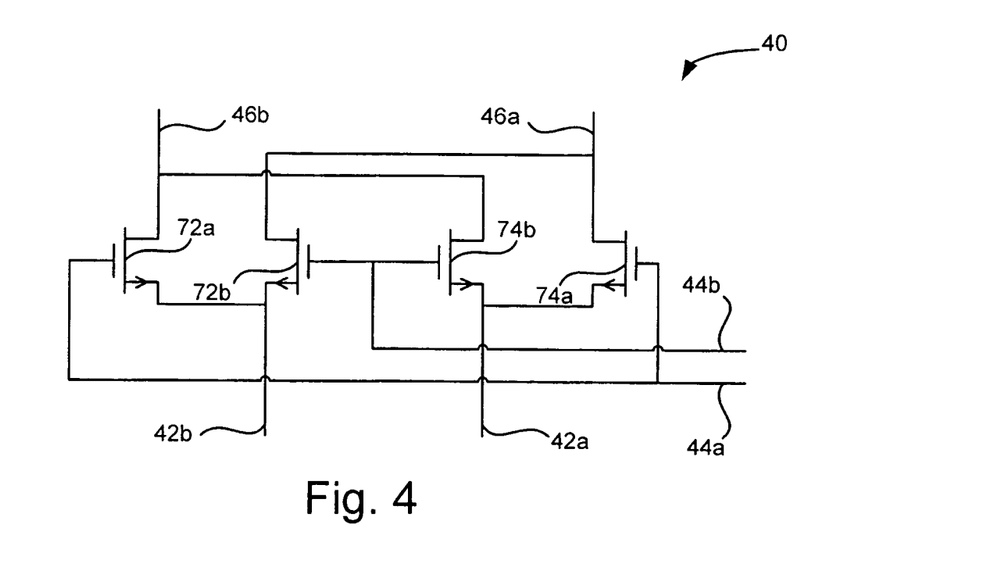
FIG. 4 is a schematic circuit diagram of a switched mixer element according to an embodiment of the present invention.

FIG. 4 is a schematic circuit diagram of an embodiment of the switched mixer element 40. The embodiment of the switched mixer element 40 illustrated in FIG. 4 is suitable for use together with the embodiment of the unit element 10 in FIG. 3. According to the embodiment, the switched mixer element 40 comprises transistors 72a-b and 74a-b. The gate terminals of the transistors 72a and 74a are both connected to the control terminal 44a, and the gate terminals of the transistors 72b and 74b are both connected to the control terminal 44b. The source terminals of the transistors 72a-b are both connected to the input terminal 42b, and the source terminals of the transistors 74a-b are both connected to the input terminal 42a. The drain terminals of the transistors 72a and 74b are both connected to the output terminal 46b, and the drain terminals of the transistors 72b and 74a are both connected to the output terminal 46a. In a first state of the sign of the discrete-time mixing signal, the transistors 72a and 74a are switched on, whereas the transistors 72b and 74b are switched off. In that first state, the current delivered to the input terminal 42a is forwarded to the output terminal 46a, and the current delivered to the input terminal 42b is forwarded to the output terminal 46b. In the other state of the sign of the discrete-time mixing signal, the polarity of the switched mixer element 40 is reversed compared with the first state such that the transistors 72b and 74b are switched on, whereas the transistors 72a and 74a are switched off. In that other state, the current delivered to the input terminal 42a is forwarded to the output terminal 46b, and the current delivered to the input terminal 42b is forwarded to the output terminal 46a.

It should be emphasized that the schematic circuit diagrams shown in FIGS. 3 and 4 are only examples, and numerous modifications can be made thereto. For example, intervening elements, such as but not limited to passive components or cascode transistors, may be inserted in the signal path between two terminals that are illustrated in the Figures as directly connected. Furthermore, a complementary solution, where the depicted NMOS transistors are replaced with PMOS transistors and the connection to ground in FIG. 3 is replaced with a connection to a positive supply voltage is also possible.

In a further alternative embodiment (not shown), the function of the switched mixer 40 (FIG. 2) is distributed to the unit elements 10-1, ..., 10-N. In this embodiment, each unit element 10-1, ..., 10-N is adapted to generate the output signal of the unit element 10-1, ..., 10-N by mixing the analog input signal of the mixer arrangement 1 with the sign of the discrete-time mixing signal in the enabled state. As a nonlimiting example, each unit element 10-1, ..., 10-N may be implemented with a switchable transconductor of the type illustrated in FIG. 3 and a switched mixer of the type illustrated in FIG. 4, having the terminals 42a and 42b connected to the terminals 16a and 16b, respectively, of the switchable transconductor. In this embodiment, as for the embodiment illustrated in FIG. 2, the control signal is equal to the absolute value of the discrete-time mixing signal. Furthermore, for this embodiment, as for the embodiment illustrated in FIG. 1, mixer arrangement 1 may be adapted to generate the output signal of the mixer arrangement 1 equal to or proportional to the common output signal. The output signal of this embodiment is, as for the embodiment illustrated in FIG. 2, given by Eq. 6 above. Hence, this embodiment also has the advantage over the embodiment illustrated in FIG. 1 that the term kx(t) $m_{LS}$ is absent in the analog output signal.

Figure 5:
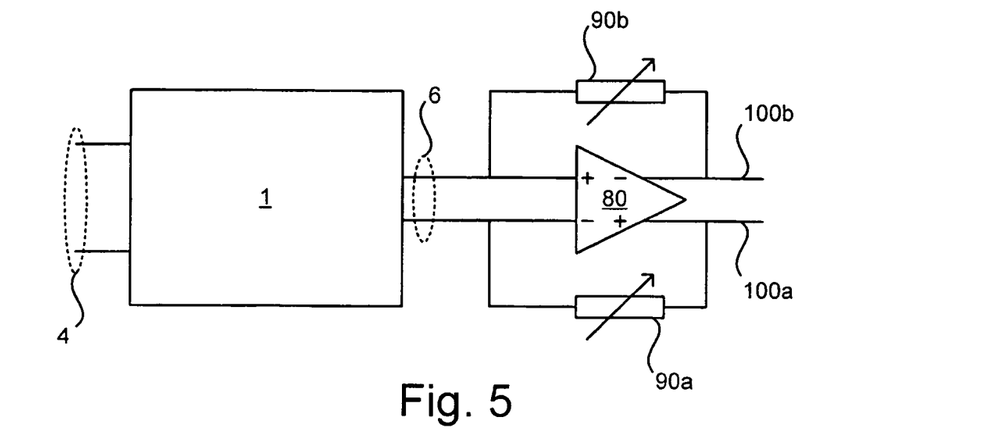
FIG. 5 is a block diagram of a mixer arrangement and an amplifier circuit according to an embodiment of the present invention.

As is further described below with reference to FIG. 10, the number of unit elements 10-1, ..., 10-N to be enabled when the control signal adopts a particular given value, such as a maximum value, may be adjusted to reduce the impact of quantization of the discrete-time mixing signal and control signal. Such an adjustment results in a change of the gain of the mixer arrangement 1. This change in gain may need to be compensated for. A gain compensation circuit with variable gain for compensating a change in the number of unit elements to be enabled when the control signal adopts said particular given value may therefore be included in some embodiments. The gain compensation circuit may be comprised in the mixer arrangement 1 or be external to the mixer arrangement 1. The gain compensation circuit may e.g. be adapted to compensate for said change such as to maintain a constant overall gain of the mixer arrangement 1 (or combination of mixer arrangement 1 and gain compensation circuit in the case of an external gain compensation circuit) irrespective of the said number of unit elements used to represent said particular given value of the control signal, or to keep said overall gain within a certain interval. FIG. 5 illustrates an embodiment of a gain compensation circuit external to the mixer arrangement 1. The embodiment of the gain compensation circuit illustrated in FIG. 5 is a transimpedance amplifier circuit comprising an operational amplifier 80 and variable feedback resistors 90a and 90b. The gain compensation circuit is connected to the output port 6 of the mixer arrangement 1. The gain compensated output signal is generated on a differential output port comprising the output terminals 100a-b. A corresponding solution with the gain compensation circuit comprised in the mixer arrangement 1, rather than external to it, can be obtained by simply considering the output port comprising the output terminals 100a-b as the output port of the mixer arrangement 1 rather than the output port 6.

In a pure switched mixer, i.e. a mixer that performs mixing with a square wave mixing signal, unwanted signal components are mixed into the same frequency band as the wanted signal due to harmonics of the square wave. This normally requires that these unwanted signal components be suppressed by filtering before the mixer. Such filtering may be complex, especially if the allocated frequency band to (in the case of up conversion) or from (in the case of down conversion) the wanted signal is to be frequency translated is not fixed, but may vary e.g. in location and/or bandwidth.

In comparison with a pure switched mixer (i.e. a mixer that performs mixing with a square wave), the unit element approach used in the mixer arrangement 1 according to embodiments of the present invention facilitates a reduction of the problem with harmonics mentioned above, since the mixing can be performed more like a linear mixer, i.e. a mixer that performs mixing with a continuous-time sinusoidal mixing signal. Hence, the filtering requirements of the above-mentioned unwanted signal components may be relaxed.

Compared with a linear mixer, the unit element approach utilized in the mixer arrangement 1 according to embodiments of the present invention provides a flexible solution that can be relatively easily adjusted to operate at different mixing frequencies $f_M$ by appropriate adjustment of the enable signals that control the unit elements. Furthermore, suppression of harmonics of the discrete-time mixing signal is facilitated, e.g. as illustrated below.

According to some embodiments of the present invention, the control unit 30 may be adapted to set the sampling frequency $f_S$ of the discrete-time mixing signal for suppressing certain undesired harmonics of the discrete-time mixing signal. For example, if $f_S = L \cdot f_M$, where L is an integer, the only harmonics that (ideally) appears are those at $m \cdot f_S \pm f_M = (m \cdot L \pm 1) f_M$ where m=1,2,3, ..., i.e. the harmonics of order $(m \cdot L \pm 1)$. However, due e.g. to the quantized representation, matching inaccuracies between unit elements, etc., the other harmonics will in practice be suppressed but not be completely eliminated. As an example, in order to suppress all harmonics of order N and lower, L should be selected as $L \geq N+2$. Note that this selection of L also suppresses other harmonics than only those of order N and lower. The selection of L, which may also be made by the control unit 30, may in turn be based e.g. on knowledge of the surrounding radio environment. For example, if it is known that a strong interferer is present in a frequency band that would be frequency translated by a particular harmonic such that it interferes with the desired signal, this harmonic should be suppressed. However, if on the other hand only negligible signal content is present in such a frequency band, the harmonic need not necessarily be suppressed. According to some embodiments of the present invention, L is selected as the lowest integer such that all harmonics that need to be suppressed are suppressed.

Figure 6:
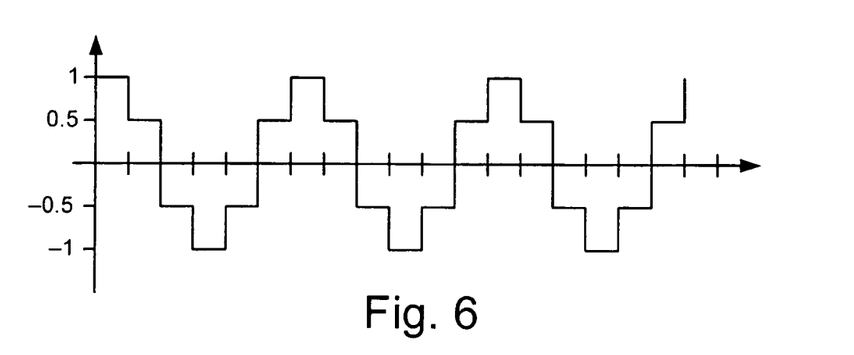
FIGS. 6-7 show signal plots according to embodiments of the present invention.

FIG. 6 illustrates a specific example of a discrete-time mixing signal that is used in some embodiments of the present invention. The plotted discrete-time mixing signal has an amplitude A=1 (compare with Eq. 1). However, another amplitude A may be used as well. Furthermore, the sampling frequency $f_S$ of the discrete time mixing signal is set to $6 \cdot f_M$, and the phase-shift φ (see Eq. 1) of the discrete-time mixing signal is set such that the samples of the discrete-time mixing signal is given by $$\sin\left(\frac{\pi}{3}n + \frac{\pi}{3}L_0 - \frac{\pi}{6}\right) \qquad \text{(Eq. 7)}$$

where $L_0$ is an integer. For this signal, harmonics of integer multiple orders of 3 of the discrete-time mixing signal are suppressed. Furthermore, the only sample values of the discrete-time mixing signal are −1, −0.5, 0.5, and 1. Notably, these values can be represented in a quantized form with evenly spaced quantization levels without any quantization error, which is advantageous for the suppression of harmonics of the discrete-time mixing signal.

Figure 7:
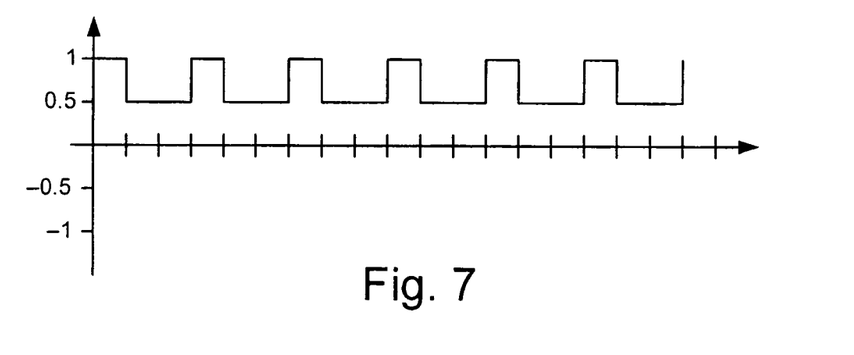

In FIG. 7, the absolute value of the signal plotted in FIG. 6 is plotted. Using the discrete-time mixing signal illustrated in FIG. 6 in the embodiment of the mixer arrangement illustrated in FIG. 2 results in a control signal that is equal to the signal plotted in FIG. 7. Notably, the signal plotted in FIG. 7 adopts only two values: 0.5 and 1. If the value 0.5 corresponds to M unit elements being enabled, where M is an integer, then the value 1 would correspond to 2M unit elements being enabled. For the case M=1, only two unit elements are actually required for this particular discrete-time mixing signal (although more unit elements may naturally be included in the mixer arrangement 1 to enable the use of other control signals as well).

Figure 8:
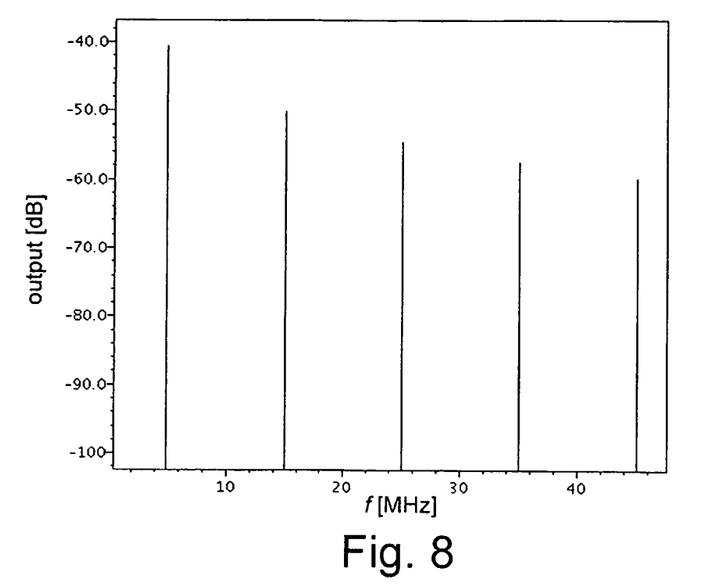
FIGS. 8-9 show signal spectra according to simulation examples.
Figure 9:
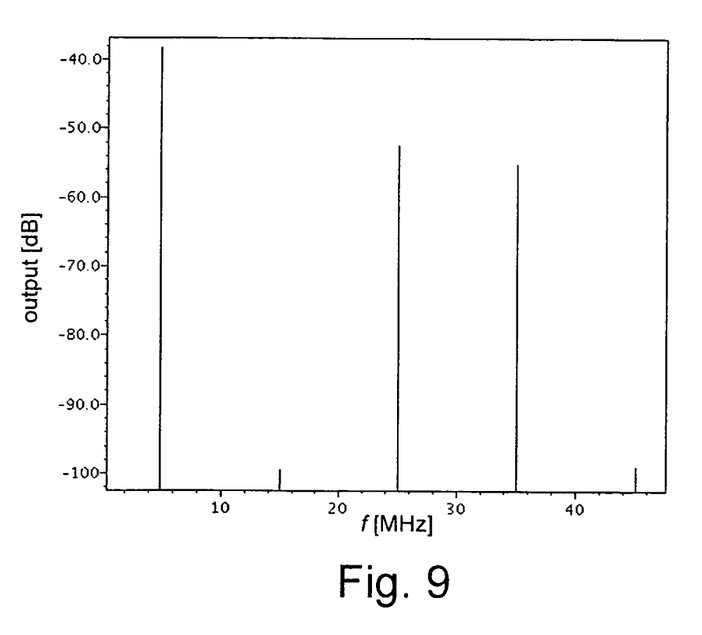

In order to illustrate the suppression of harmonics, simulated output spectra from an embodiment of the mixer arrangement 1 of the type illustrated in FIG. 2 having two unit elements 10-1, ..., 10-N implemented with NMOS transistors as illustrated in FIG. 3, and with the switched mixer element 40 implemented as illustrated in FIG. 4, but with ideal switches instead of the transistors 72a-b and 74a-b are plotted in FIGS. 8 and 9.

The analog input signal to the mixer arrangement 1 for these simulations is a non-zero DC signal. Hence, in each figure, the plotted spectrum is a spectrum of an "effective LO signal", i.e. can be considered as the spectrum of the mixing signal (or a signal proportional to the mixing signal) for the corresponding simulation.

For the simulation illustrated in FIG. 9, the discrete-time mixing signal and control signal illustrated in FIG. 6 and FIG. 7, respectively, are used. For the simulation illustrated in FIG. 8, the same control signal is used for the switched mixer element 40 as for the simulation of FIG. 9. The unit elements 10-1, ..., 10-N are however controlled in a different way, one of them is constantly enabled and the other constantly disabled. In this configuration, the mixer arrangement 1 is operated more or less as a conventional Gilbert cell mixer driven by a square-wave local-oscillator signal. Hence, the plotted spectrum in FIG. 8 is more or less the spectrum of a square wave, and is used below as a reference example for comparison in order to illustrate the suppression of harmonics that are obtained with the proposed method used for the simulation illustrated in FIG. 9.

The suppression of harmonics can e.g. be illustrated by considering the third harmonic. In FIG. 8, the third harmonic is approximately 10 dB below the fundamental tone, whereas in FIG. 9, the third harmonic is approximately 62 dB below the fundamental tone, which corresponds to a suppression of 52 dB in FIG. 9 compared with FIG. 8. As can bee seen from FIG. 9, also the ninth harmonic is largely suppressed (which conforms with the discussion above that harmonics of integer multiple orders of three are suppressed with the signals illustrated in FIGS. 6 and 7). Furthermore, even order harmonics are efficiently suppressed by the differential architecture.

Although it is possible to represent the signals plotted in FIGS. 6 and 7 with a finite number of equally spaced quantization levels without quantization errors, other discrete-time mixing signals may have sample values that cannot be represented in such a way without quantization errors, such as irrational sample values. Consider for example the signal sin ($\pi n/4$) which adopts the values 0, $\pm\sqrt{2}/2$, and $\pm 1$. A corresponding control signal for the embodiment of the mixer arrangement illustrated in FIG. 2 would adopt the sample values 0, $\sqrt{2}/2$, and 1. If the range between 0 and 1 is divided into an integer number of equally spaced quantization levels, two of which coincides with 0 and 1, the value $\sqrt{2}/2$ cannot be represented without quantization error. Said number of equally spaced quantization levels is in the following referred to as the "number of levels representing unity", which corresponds in the control of the mixer arrangement 1 to the number of unit elements to be enabled when the control signal adopts a maximum value (said maximum value being 1 in this example).

Figure 10:
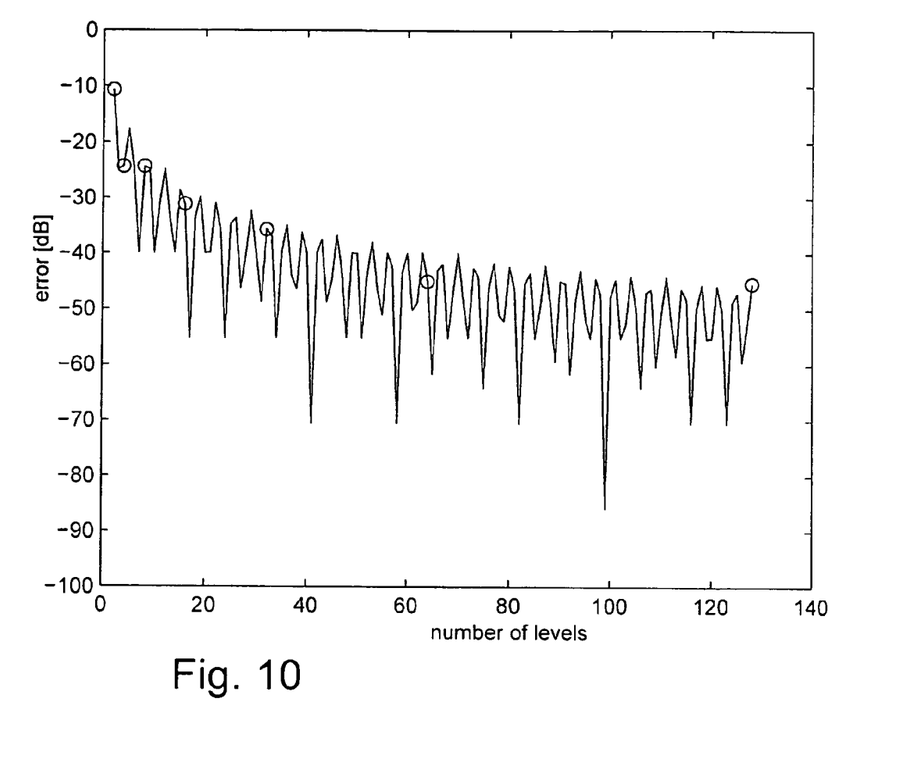
FIG. 10 is a plot illustrating the quantization error for representations of $\sqrt{2}/2$ for different numbers of levels representing unity.

The relative quantization error for representing $\sqrt{2}/2$ is plotted as a function of the number of levels representing unity in FIG. 10. The circles included in the plot indicate the values corresponding to a representation of unity with an integer number of bits. As can be seen from FIG. 10, the error does not decrease monotonically with an increasing number of levels. Instead, the plot is "saw-tooth shaped" with a number of relatively deep dips for certain numbers of levels for which one of the levels comes relatively close to $\sqrt{2}/2$. It can e.g. be deduced from the plotted data that for the signal considered in this example, the influence of the quantization error is considerably lower for 41 levels representing unity than for 64 (corresponding to a 6-bit representation), but also for e.g. 17 levels.

Accordingly, in some embodiments, the control unit 30 may be adapted to select the number of unit elements 10-1, . . . , 10-N to be enabled when the control signal adopts a particular given value, such as a maximum value, differently for different discrete-time control signals in order to suppress the impact of the quantization errors. Proper selection of the number of unit elements 10-1, . . . , 10-N to be enabled when the control signal adopts the particular given value may e.g. depend on the ratio $f_S/f_M$ and/or the phase shift $\phi$ of the discrete-time mixing signal, since these parameters influence which the sample values of the discrete-time mixing signal and the control signal to be represented with the corresponding quantization levels are.

Therefore, in accordance with some embodiments of the present invention, the control unit 30 is adapted to select the number of unit elements 10-1, . . . , 10-N to be enabled when the control signal adopts a particular given value based on a parameter set of one or more control parameters. The parameter set may comprise the ratio $f_S/f_M$ between the sampling frequency $f_S$ and the frequency $f_M$ of the discrete time mixing signal and/or a phase shift of the discrete-time mixing signal.

The control unit 30 may e.g. comprise a look-up table (not shown) having stored therein predetermined values representing said number of unit elements to be enabled when the control signal adopts said particular given value to be selected based on the control parameters in the parameter set.

Another source of signal errors is mismatch between individual unit elements 10-1, . . . , 10-N. If the same unit elements 10-1, . . . , 10-N are enabled each time the discrete-time mixing signal adopts a certain value, a periodic error with the same periodicity as the discrete-time mixing signal results from such mismatch, which in turn contributes to and may limit the suppression of harmonics of the discrete-time mixing signal. According to some embodiments of the present invention, a dynamic element matching (DEM) scheme is employed to reduce the impact of the mismatch. For these embodiments, the control unit 30 is adapted to dynamically select the unit element or elements 10-1, . . . , 10-N to be enabled for a given value of the control signal according to the DEM scheme for suppressing mismatch between unit elements 10-1, . . . , 10-N. For example, even though the number of unit elements 10-1, . . . , 10-N to be enabled is determined by the control signal, the control unit may select different unit elements 10-1, . . . , 10-N for different samples of the control signal having the same value. The dynamic selection of unit elements 10-1, . . . , 10-N may e.g. be based on a random or pseudo-random sequence. DEM algorithms have e.g. been developed in the field of digital-to-analog converters (DACs), and DEM algorithms developed for DACs may be utilized also for implementing DEM in the mixer arrangement 1.

According to some embodiments of the present invention, a method of operating the mixer arrangement 1 is provided. The method may e.g. be performed by the control unit 30. The method comprises generating the control signal from the discrete-time mixing signal. Furthermore, the method comprises generating said enable signals to the unit elements based on the discrete-time mixing signal such that the number of enabled unit elements 10-1, . . . , 10-N is proportional to the control signal.

For the embodiment of the mixer arrangement 1 illustrated in FIG. 1, generating the control signal may comprise generating the control signal equal to a level-shifted version of the discrete-time mixing signal.

For the embodiment of the mixer arrangement 1 illustrated in FIG. 2, and the embodiment where each of the unit elements 10-1, . . . , 10-N is adapted to mix the analog input signal of the mixer arrangement 1 with the sign of the discrete-time mixing signal, generating the control signal may comprise generating the control signal equal to the absolute value of the discrete-time mixing signal.

The method may further comprise setting the sampling frequency $f_S$ of the discrete-time mixing signal to $f_S = L \cdot f_M$, selecting the value of L large enough such that all harmonics in a set of harmonics to be suppressed are suppressed as described above.

The method may comprise setting the sampling frequency $f_S$ of the discrete time mixing signal to $6 \cdot f_M$, and setting a phase-shift of the discrete-time mixing signal such that the samples of the discrete-time mixing signal is given by $$A \cdot \sin\left(\frac{\pi}{3}n + \frac{\pi}{3}L_0 - \frac{\pi}{6}\right)$$

as described above for suppressing harmonics of integer multiple orders of 3 of the discrete-time mixing signal.

Furthermore, in accordance with what is described above, the method may comprise selecting the number of unit elements 10-1, . . . , 10-N to be enabled when the control signal adopts a particular given value, such as a maximum value, based on said parameter set of one or more control parameters. As above, said parameter set may comprise the ratio $f_S/f_M$ and/or the phase shift φ of the discrete-time mixing signal. Furthermore, selecting the number of unit elements 10-1, . . . , 10-N to be enabled when the control signal adopts said particular given value may comprise fetching, based on the control parameters in the parameter set, a value representing said number of unit elements 10-1, . . . , 10-N from the above-mentioned look-up table having stored therein predetermined such values.

Moreover, the method may comprise dynamically selecting the unit element or elements 10-1, . . . , 10-N to be enabled for a given value of the control signal according to a DEM scheme for suppressing mismatch between unit elements as described above.

Figure 11:
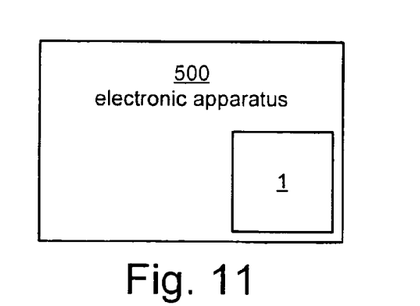
FIG. 11 schematically illustrates an electronic apparatus according to an embodiment of the present invention.

According to some embodiments of the present invention, an electronic apparatus comprises the mixer arrangement 1. This is schematically illustrated in FIG. 11, showing an electronic apparatus 500 comprising the mixer arrangement 1. The electronic apparatus may e.g. be, but is not limited to, a portable communication apparatus such as a mobile phone, smartphone, portable computer with radio communication capability, or the like.

The present invention has been described above with reference to specific embodiments. However, other embodiments than the above described are possible within the scope of the invention. Different method steps than those described above, performing the method by hardware or software, may be provided within the scope of the invention. The different features and steps of the embodiments may be combined in other combinations than those described. The scope of the invention is only limited by the appended patent claims.

The invention claimed is:

1. A mixer arrangement for generating an analog output signal of the mixer arrangement by mixing an analog input signal of the mixer arrangement with a discrete-time mixing signal, the mixer arrangement comprising:
    a plurality of unit elements, each comprises:
        an enable port for receiving an enable signal of the unit element,
        an input port for receiving the analog input signal of the mixer arrangement, and
        an output port for outputting an output signal of the unit element,
    wherein, for each unit element, the unit element is adapted to
        be in an enabled mode in a first state of the enable signal and in a disabled mode in a second state of the enable signal, and
        generate the output signal of the unit element such that the output signal of the unit element is based on the analog input signal of the mixer arrangement if the unit element is in the enabled mode but not in the disabled mode,
    wherein,
        the unit elements are connected for generating a common output signal as the sum of the output signals from the unit elements,
        the mixer arrangement is adapted to generate the analog output signal of the mixer arrangement based on the common output signal,
        the mixer arrangement comprises a control unit adapted to supply the enable signals to the unit elements and control said enable signals based on the discrete-time mixing signal such that the number of enabled unit elements is proportional to a control signal derived from the discrete-time mixing signal, and
        the control unit is adapted to select the number of unit elements to be enabled when the control signal adopts a given value based on a parameter set of one or more control parameters, wherein said parameter set comprises one or more of
            the ratio $f_S/f_M$ between the sampling frequency $f_S$ and the frequency $f_M$ of the discrete time mixing signal, and
            a phase shift of the discrete-time mixing signal,
        wherein the mixer arrangement is adapted to generate the analog output signal of the mixer arrangement proportional to the common output signal, the control signal is equal to the absolute value of the discrete-time mixing signal, and each unit element is adapted to generate the output signal of the unit element by mixing the analog input signal of the mixer arrangement with the sign of the discrete-time mixing signal in the enabled state.

2. The mixer arrangement according to claim 1, wherein the control unit is adapted to, based on a set of harmonics of the discrete-time mixing signal to be suppressed, set the sampling frequency $f_S$ of the discrete-time mixing signal to $f_s = L \cdot f_M$, where L is an integer >1 and $f_M$ is the frequency of the discrete-time mixing signal, and select the value of L large enough such that all harmonics in said set of harmonics to be suppressed are suppressed.

3. The mixer arrangement according to claim 1, wherein the control unit (30) is adapted to set the sampling frequency $f_S$ of the discrete-time mixing signal to $6 \cdot f_M$, where $f_M$ is the frequency of the discrete-time mixing signal, and set a phase-shift of the discrete-time mixing signal such that the samples of the discrete-time mixing signal are given by $$A \cdot \sin\left(\frac{\pi}{3}n + \frac{\pi}{3}L_0 - \frac{\pi}{6}\right)$$

where A is a constant, n is a sequence index, and $L_O$ is an integer, for suppressing harmonics of integer multiple orders of 3 of the discrete-time mixing signal.

4. The mixer arrangement according to claim 1, wherein the control unit comprises a look-up table having stored therein predetermined values representing said number of unit elements to be enabled when the control signal adopts said given value to be selected based on the control parameters in the parameter set.

5. The mixer arrangement according to claim 1, further comprising a gain compensation circuit with variable gain for compensating a change in the number of unit elements to be enabled when the control signal adopts said given value.

6. The mixer arrangement according to claim 1, wherein the control unit is adapted to dynamically select the unit element or elements to be enabled for a given value of the control signal according to a dynamic element matching scheme for suppressing mismatch between unit elements.

7. The mixer arrangement according to claim 1, wherein each unit element comprises a switchable transconductor.

8. The mixer arrangement according to claim 1, wherein the mixer arrangement has a differential architecture.

9. A mixer arrangement for generating an analog output signal of the mixer arrangement by mixing an analog input signal of the mixer arrangement with a discrete-time mixing signal, the mixer arrangement comprising:
    a plurality of unit elements, each comprises:
        an enable port for receiving an enable signal of the unit element, an input port for receiving the analog input signal of the mixer arrangement, and
an output port for outputting an output signal of the unit element,
wherein, for each unit element, the unit element is adapted to
be in an enabled mode in a first state of the enable signal and in a disabled mode in a second state of the enable signal, and
generate the output signal of the unit element such that the output signal of the unit element is based on the analog input signal of the mixer arrangement if the unit element is in the enabled mode but not in the disabled mode,
wherein,
the unit elements are connected for generating a common output signal as the sum of the output signals from the unit elements,
the mixer arrangement is adapted to generate the analog output signal of the mixer arrangement based on the common output signal,
the mixer arrangement comprises a control unit adapted to supply the enable signals to the unit elements and control said enable signals based on the discrete-time mixing signal such that the number of enabled unit elements is proportional to a control signal derived from the discrete-time mixing signal, and
the control unit is adapted to select the number of unit elements to be enabled when the control signal adopts a given value based on a parameter set of one or more control parameters, wherein said parameter set comprises one or more of
the ratio $f_S/f_M$ between the sampling frequency $f_S$ and the frequency $f_M$ of the discrete time mixing signal, and
a phase shift of the discrete-time mixing signal,
wherein, the mixer arrangement further comprises a switched mixer element arranged to receive the common output signal on an input port and the sign of the discrete-time mixing signal on a control port, wherein the switched mixer element is adapted to mix the common output signal with the sign of the discrete-time mixing signal for generating the analog output signal of the mixer arrangement, the control signal is equal to the absolute value of the discrete-time mixing signal, and each unit element is adapted to generate the output signal of the unit element as an essentially linear function of the analog input signal of the mixer arrangement.

10. The mixer arrangement according to claim 9, wherein the control unit is adapted to, based on a set of harmonics of the discrete-time mixing signal to be suppressed, set the sampling frequency $f_S$ of the discrete-time mixing signal to $f_s = L \cdot f_M$, where L is an integer >1 and $f_M$ is the frequency of the discrete-time mixing signal, and select the value of L large enough such that all harmonics in said set of harmonics to be suppressed are suppressed.

11. The mixer arrangement according to claim 9, wherein the control unit (30) is adapted to set the sampling frequency $f_S$ of the discrete-time mixing signal to $6 \cdot f_M$, where $f_M$ is the frequency of the discrete-time mixing signal, and set a phase-shift of the discrete-time mixing signal such that the samples of the discrete-time mixing signal are is given by $$A \cdot \sin\left(\frac{\pi}{3}n + \frac{\pi}{3}L_0 - \frac{\pi}{6}\right)$$

where A is a constant, n is a sequence index, and $L_0$ is an integer, for suppressing harmonics of integer multiple orders of 3 of the discrete-time mixing signal.

12. The mixer arrangement according to claim 9, wherein the control unit comprises a look-up table having stored therein predetermined values representing said number of unit elements to be enabled when the control signal adopts said given value to be selected based on the control parameters in the parameter set.

13. The mixer arrangement according to claim 9, further comprising a gain compensation circuit with variable gain for compensating a change in the number of unit elements to be enabled when the control signal adopts said given value.

14. The mixer arrangement according to claim 9, wherein the control unit is adapted to dynamically select the unit element or elements to be enabled for a given value of the control signal according to a dynamic element matching scheme for suppressing mismatch between unit elements.

15. The mixer arrangement according to claim 9, wherein each unit element comprises a switchable transconductor.

16. The mixer arrangement according to claim 9, wherein the mixer arrangement has a differential architecture.

17. A method of operating a mixer arrangement for generating an analog output signal of the mixer arrangement by mixing an analog input signal of the mixer arrangement with a discrete-time mixing signal, wherein the mixer arrangement comprises:
a plurality of unit elements, each comprising:
an enable port for receiving an enable signal of the unit element,
an input port for receiving the analog input signal of the mixer arrangement, and
an output port for outputting an output signal of the unit element,
wherein, for each unit element, the unit element is adapted to
be in an enabled mode in a first state of the enable signal and in a disabled mode in a second state of the enable signal, and
generate the output signal of the unit element such that the output signal of the unit element is based on the analog input signal of the mixer arrangement if the unit element is in the enabled mode but not in the disabled mode,
wherein
the unit elements are connected for generating a common output signal as the sum of the output signals from the unit elements, and
the mixer arrangement is adapted to generate the analog output signal of the mixer arrangement based on the common output signal,
the method comprising:
generating a control signal from the discrete-time mixing signal;
generating said enable signals to the unit elements based on the discrete-time mixing signal such that the number of enabled unit elements is proportional to the control signal; and
selecting the number of unit elements to be enabled when the control signal adopts a given value based on a parameter set of one or more control parameters, wherein said parameter set comprises one or more of
the ratio $f_S/f_M$ between the sampling frequency $f_S$ and the frequency $f_M$ of the discrete time mixing signal; and
a phase shift of the discrete-time mixing signal,
wherein the mixer arrangement is adapted to generate the analog output signal of the mixer arrangement proportional to the common output signal, each unit element is adapted to generate the output signal of the unit element by mixing the analog input signal of the mixer arrangement with the sign of the discrete-time mixing signal in the enabled state, and generating the control signal comprises generating the control signal equal to the absolute value of the discrete-time mixing signal.

18. The method according to claim 17, further comprising, based on a set of harmonics of the discrete-time mixing signal to be suppressed,
setting the sampling frequency $f_S$ of the discrete-time mixing signal to $f_S = L \cdot f_M$, where L is an integer >1 and $f_M$ is the frequency of the discrete-time mixing signal; and
selecting the value of L large enough such that all harmonics in said set of harmonics to be suppressed are suppressed.

19. The method according to claim 17, further comprising setting the sampling frequency $f_S$ of the discrete-time mixing signal to $6 \cdot f_M$, where $f_M$ is the frequency of the discrete-time mixing signal, and setting a phase-shift of the discrete-time mixing signal such that the samples of the discrete-time mixing signal is given by $$A \cdot \sin\left(\frac{\pi}{3}n + \frac{\pi}{3}L_0 - \frac{\pi}{6}\right)$$

where A is a constant, n is a sequence index, and $L_0$ is an integer, for suppressing harmonics of integer multiple orders of 3 of the discrete-time mixing signal.

20. The method according to claim 17, wherein selecting the number of unit elements to be enabled when the control signal adopts said given value comprises fetching, based on the control parameters in the parameter set, a value representing said number of unit elements from a look-up table having stored therein predetermined values.

21. The method according to claim 17, further comprising dynamically selecting the unit element or elements to be enabled for a given value of the control signal according to a dynamic element matching scheme for suppressing mismatch between unit elements.

22. A method of operating a mixer arrangement for generating an analog output signal of the mixer arrangement by mixing an analog input signal of the mixer arrangement with a discrete-time mixing signal, wherein the mixer arrangement comprises:
a plurality of unit elements, each comprising:
an enable port for receiving an enable signal of the unit element,
an input port for receiving the analog input signal of the mixer arrangement, and
an output port for outputting an output signal of the unit element,
wherein, for each unit element, the unit element is adapted to
be in an enabled mode in a first state of the enable signal and in a disabled mode in a second state of the enable signal, and
generate the output signal of the unit element such that the output signal of the unit element is based on the analog input signal of the mixer arrangement if the unit element is in the enabled mode but not in the disabled mode,
wherein
the unit elements are connected for generating a common output signal as the sum of the output signals from the unit elements, and
the mixer arrangement is adapted to generate the analog output signal of the mixer arrangement based on the common output signal,
the method comprising:
generating a control signal from the discrete-time mixing signal;
generating said enable signals to the unit elements based on the discrete-time mixing signal such that the number of enabled unit elements is proportional to the control signal; and
selecting the number of unit elements to be enabled when the control signal adopts a given value based on a parameter set of one or more control parameters, wherein said parameter set comprises one or more of
the ratio $f_S/f_M$ between the sampling frequency $f_S$ and the frequency $f_M$ of the discrete time mixing signal; and
a phase shift of the discrete-time mixing signal,
wherein the mixer arrangement further comprises a switched mixer element arranged to receive the common output signal on an input port and the sign of the discrete-time mixing signal on a control port, the switched mixer element is adapted to mix the common output signal with the sign of the discrete-time mixing signal for generating the analog output signal of the mixer arrangement, each unit element is adapted to generate the output signal of the unit element as an essentially linear function of the analog input signal of the mixer arrangement, and generating the control signal comprises generating the control signal equal to the absolute value of the discrete-time mixing signal.

23. The method according to claim 22, further comprising, based on a set of harmonics of the discrete-time mixing signal to be suppressed,
setting the sampling frequency $f_S$ of the discrete-time mixing signal to $f_S = L \cdot f_M$, where L is an integer >1 and $f_M$ is the frequency of the discrete-time mixing signal; and
selecting the value of L large enough such that all harmonics in said set of harmonics to be suppressed are suppressed.

24. The method according to claim 22, further comprising setting the sampling frequency $f_S$ of the discrete-time mixing signal to $6 \cdot f_M$, where $f_M$ is the frequency of the discrete-time mixing signal, and setting a phase-shift of the discrete-time mixing signal such that the samples of the discrete-time mixing signal is given by $$A \cdot \sin\left(\frac{\pi}{3}n + \frac{\pi}{3}L_0 - \frac{\pi}{6}\right)$$

where A is a constant, n is a sequence index, and $L_0$ is an integer, for suppressing harmonics of integer multiple orders of 3 of the discrete-time mixing signal.

25. The method according to claim 22, wherein selecting the number of unit elements to be enabled when the control signal adopts said given value comprises fetching, based on the control parameters in the parameter set, a value representing said number of unit elements from a look-up table having stored therein predetermined values.

26. The method according to claim 22, further comprising dynamically selecting the unit element or elements to be enabled for a given value of the control signal according to a dynamic element matching scheme for suppressing mismatch between unit elements.

27. An electronic apparatus comprising a mixer arrangement for generating an analog output signal of the mixer arrangement by mixing an analog input signal of the mixer arrangement with a discrete-time mixing signal, the mixer arrangement comprising:

a plurality of unit elements, each comprises:

an enable port for receiving an enable signal of the unit element, an input port for receiving the analog input signal of the mixer arrangement, and an output port for outputting an output signal of the unit element, wherein, for each unit element, the unit element is adapted to be in an enabled mode in a first state of the enable signal and in a disabled mode in a second state of the enable signal, and generate the output signal of the unit element such that the output signal of the unit element is based on the analog input signal of the mixer arrangement if the unit element is in the enabled mode but not in the disabled mode, wherein, the unit elements are connected for generating a common output signal as the sum of the output signals from the unit elements, the mixer arrangement is adapted to generate the analog output signal of the mixer arrangement based on the common output signal, the mixer arrangement comprises a control unit adapted to supply the enable signals to the unit elements and control said enable signals based on the discrete-time mixing signal such that the number of enabled unit elements is proportional to a control signal derived from the discrete-time mixing signal, and the control unit is adapted to select the number of unit elements to be enabled when the control signal adopts a given value based on a parameter set of one or more control parameters, wherein said parameter set comprises one or more of the ratio $f_S/f_M$ between the sampling frequency $f_S$ and the frequency $f_M$ of the discrete time mixing signal, and a phase shift of the discrete-time mixing signal, wherein the mixer arrangement is adapted to generate the analog output signal of the mixer arrangement proportional to the common output signal, the control signal is equal to the absolute value of the discrete-time mixing signal, and each unit element is adapted to generate the output signal of the unit element by mixing the analog input signal of the mixer arrangement with the sign of the discrete-time mixing signal in the enabled state.

28. An electronic apparatus comprising a mixer arrangement for generating an analog output signal of the mixer arrangement by mixing an analog input signal of the mixer arrangement with a discrete-time mixing signal, the mixer arrangement comprising:

a plurality of unit elements, each comprises:

an enable port for receiving an enable signal of the unit element, an input port for receiving the analog input signal of the mixer arrangement, and an output port for outputting an output signal of the unit element, wherein, for each unit element, the unit element is adapted to be in an enabled mode in a first state of the enable signal and in a disabled mode in a second state of the enable signal, and generate the output signal of the unit element such that the output signal of the unit element is based on the analog input signal of the mixer arrangement if the unit element is in the enabled mode but not in the disabled mode, wherein, the unit elements are connected for generating a common output signal as the sum of the output signals from the unit elements, the mixer arrangement is adapted to generate the analog output signal of the mixer arrangement based on the common output signal, the mixer arrangement comprises a control unit adapted to supply the enable signals to the unit elements and control said enable signals based on the discrete-time mixing signal such that the number of enabled unit elements is proportional to a control signal derived from the discrete-time mixing signal, and the control unit is adapted to select the number of unit elements to be enabled when the control signal adopts a given value based on a parameter set of one or more control parameters, wherein said parameter set comprises one or more of the ratio $f_S/f_M$ between the sampling frequency $f_S$ and the frequency $f_M$ of the discrete time mixing signal, and a phase shift of the discrete-time mixing signal, wherein, the mixer arrangement further comprises a switched mixer element arranged to receive the common output signal on an input port and the sign of the discrete-time mixing signal on a control port, wherein the switched mixer element is adapted to mix the common output signal with the sign of the discrete-time mixing signal for generating the analog output signal of the mixer arrangement, the control signal is equal to the absolute value of the discrete-time mixing signal, and each unit element is adapted to generate the output signal of the unit element as an essentially linear function of the analog input signal of the mixer arrangement.

* * * * *

UNITED STATES PATENT AND TRADEMARK OFFICE
CERTIFICATE OF CORRECTION

| | | |
|---|---|---|
| PATENT NO. | : 8,664,999 B2 | Page 1 of 1 |
| APPLICATION NO. | : 13/514070 | |
| DATED | : March 4, 2014 | |
| INVENTOR(S) | : Din et al. | |

It is certified that error appears in the above-identified patent and that said Letters Patent is hereby corrected as shown below:

In the Specification

In Column 6, Line 18, delete "arrangement l" and insert -- arrangement 1 --, therefor.

In Column 7, Line 15, delete "unit clement" and insert -- unit element --, therefor.

In the Claims

In Column 16, Line 28, in Claim 3, delete "control unit (30)" and insert -- control unit --, therefor.

In Column 17, Line 57, in Claim 11, delete "control unit (30)" and insert -- control unit --, therefor.

Signed and Sealed this
Seventh Day of October, 2014

Michelle K. Lee
*Deputy Director of the United States Patent and Trademark Office*